United States Patent
Tang et al.

[19]

[11] Patent Number: 6,052,269

[45] Date of Patent: Apr. 18, 2000

[54] ELECTROSTATIC DISCHARGE PROTECTION CIRCUIT USING POINT DISCHARGE

[75] Inventors: Tien-Hao Tang, Chungho; Shiang Huang-Lu; Kuan-Yu Fu, both of Hsinchu, all of Taiwan

[73] Assignee: United Microelectronics Corp., Taiwan

[21] Appl. No.: 09/235,023

[22] Filed: Jan. 21, 1999

[30] Foreign Application Priority Data

Apr. 10, 1998 [TW] Taiwan ................................. 87105423

[51] Int. Cl.[7] .......................................................... H02H 3/22
[52] U.S. Cl. ............................... 361/111; 361/56; 361/220
[58] Field of Search ..................................... 361/111, 112, 361/128, 129, 130, 212, 561, 220; 257/355; 438/5, 10

[56] References Cited

U.S. PATENT DOCUMENTS

| | | |
|---|---|---|
| 4,617,605 | 10/1986 | Obrecht et al. ........................ 361/220 |
| 4,745,450 | 5/1988 | Hartranft et al. ....................... 257/360 |
| 4,769,736 | 9/1988 | Boy ....................................... 361/120 |
| 5,744,840 | 4/1998 | Ng ......................................... 257/360 |
| 5,786,613 | 7/1998 | Kalnitsky ............................... 257/355 |
| 5,891,760 | 4/1999 | Mekdhanasarn et al. ............. 438/123 |
| 5,946,176 | 8/1999 | Ghoshal .................................. 361/56 |

*Primary Examiner*—Jeffrey Gaffin
*Assistant Examiner*—Kim Huynh
*Attorney, Agent, or Firm*—Blakely Sokoloff Taylor & Zafman

[57] ABSTRACT

A protection circuit using point discharge suitable for use in an integrated circuit, protects circuit from damage by electrostatic discharge. The integrated circuit at least comprises an input/output port, a high voltage line, and a low voltage line. The protection circuit has point discharge structures at two ends of the input/output ports, respectively corresponding to the point discharge structures of the high and low voltage lines, and is suitable for use in all semiconductor fabricating processes.

14 Claims, 2 Drawing Sheets

ELECTROSTATIC DISCHARGE PROTECTION CIRCUIT USING POINT DISCHARGE

BACKGROUND OF THE INVENTION

1. Field of the Invention

This invention relates in general to a protection circuit suitable for use in deep sub-micron semiconductor fabrication, and more specially relates to a protection circuit for avoiding electrostatic discharge.

2. Description of Related Art

In the fabrication of integrated circuits, electrostatic discharge is usually the main cause of damage to the integrated circuits. At present time, it is one of the main reasons for malfunction in deep sub-micron integrated circuits. To overcome the problems accompanying electrostatic discharge, on-chip electrostatic discharge protection circuits are applied to the bonding pad of inputs and outputs of CMOS integrated circuits. However, with the continuing development of semiconductor fabrication, the function of electrostatic discharge protection circuits becomes increasingly insufficient. Therefore, how to effectively increase the efficiency of the electrostatic discharge protection circuits is very important for the industrial community at present.

FIG. 1 shows a conventional circuit diagram of an electrostatic discharge protection circuit. A field oxide device F1, a short channel first NMOS transistor N1, and a resistor R1 serially connected to F1 and N1 form an anti-electrostatic discharge circuit at the input of an input bonding pad 10. When an over-stress voltage is applied to the input bonding pad 10, the over-stress voltage is applied to the gate oxides of a PMOS transistor and an NMOS transistor of an input block 12 through the resistor R1. In order to control the over-stress voltage of the gate oxides of the input stage 12, the gate-grounded first NMOS transistor N1 is designed to operate at the breakdown region. Due to the high-speed operation and low working voltage in the technology of deep sub-micron integrated circuits, the thickness of the gate oxide is decreased, and the breakdown voltage of the gate oxide of input stage 12 is considerably reduced.

For the electrostatic discharge protection circuit of input stage 12 to be effective, the breakdown voltage of the gate-grounded first NMOS transistor N1 must be lower than that of the gate oxide of input stage 12. In order to provide a lower breakdown voltage, the channel length of the gate-grounded first NMOS transistor N1 should be short. An NMOS transistor with a shorter channel length usually has a lower breakdown voltage. The gate-grounded NMOS transistor with a short channel also has a lower tolerance of electrostatic discharge voltage. Therefore, a serial-connecting resistor R1 is used to limit the current of electrostatic discharge through the gate-grounded NMOS transistor N1. In order to effectively limit the current of electrostatic discharge through the NMOS transistor N1, the value of resistor R1 has to be as large as possible. However, if the value of resistor R1 connecting input bonding pad 10 and input stage 12 is too large, there will be a time delay for the input signal, which is not suitable for the high speed operation of integrated circuits.

FIG. 2 shows a circuit diagram of another conventional electrostatic discharge protection circuit. As shown in FIG. 2, a PMOS transistor P2, an NMOS transistor N2 and a resistor R2 form an anti-electrostatic discharge circuit at the input of input bonding pad 20. If a positive voltage is applied to the input bonding pad 20 when the direct bias $V_{DD}$ is grounded, a parasitic diode is formed in a PMOS transistor P2, making current flow through it. And if a negative voltage is applied to the input bonding pad 20, an avalanche breakdown occurs at the parasitic bipolar junction transistor in PMOS transistor P2 and makes current flow through it. In the same way, if a negative voltage is applied to the input bonding pad 20 when a relative low level voltage $V_{SS}$ is grounded, the parasitic diode is formed in a NMOS N2 to conduct current through it; if a positive voltage is applied to the input bonding pad 20, an avalanche breakdown occurs at the parasitic bipolar junction transistor in NMOS N2 and cause current through it.

When the gate oxide of invertor 22 of input stage is thinner, the breakdown voltages of PMOS transistor P2 and NMOS transistor N2 are approximately the same or even greater than that of the gate oxide of invertor 22. Nevertheless, if the value of resistor R2 is exceeded, it causes an operational delay. Therefore, the invertor 22 usually reaches its breakdown voltage before the parasitic bipolar transistors PNP or NPN of protection circuit turn on, so the electrostatic discharge protection circuit cannot provide effective protection for the internal circuit 24.

All of the conventional electrostatic discharge protection circuits discharge electrostatics to the direct bias $V_{DD}$ or the relative low voltage $V_{SS}$ mentioned above to protect the internal circuits by means of connecting other components serially or in parallel, of which increase the total area and affect the speed and performance. Moreover, the electrostatic discharge protection circuits always need additional and special fabricating conditions to provide proper operation, which increases the complexity of its structure.

SUMMARY OF THE INVENTION

An object of this invention is to provide a electrostatic discharge protection circuit using point discharge in order to ensure the best electric performance of an internal circuit, in which the protection circuit is suitable for all semiconductor fabricating processes and avoids the problems generated by the serial or parallel connecting components.

Additionally, in the case of integrated circuits themselves carrying a charge, this invention is also capable of protecting the integrated circuits from the damage by electrostatic discharge.

In accordance with the foregoing and other objectives an electrostatic discharge protection circuit using point discharge for protecting the integrated circuits from the electrostatic discharge is provided. This electrostatic discharge protection circuit at least comprises an input/output port, a high level voltage line, and a low level voltage line. The protection circuit has point discharge structures at two ends of the input/output port respectively corresponding to the point discharge structures of the high and low level voltage lines.

BRIEF DESCRIPTION OF THE DRAWINGS

While the specification concludes with the claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

Figure 1:
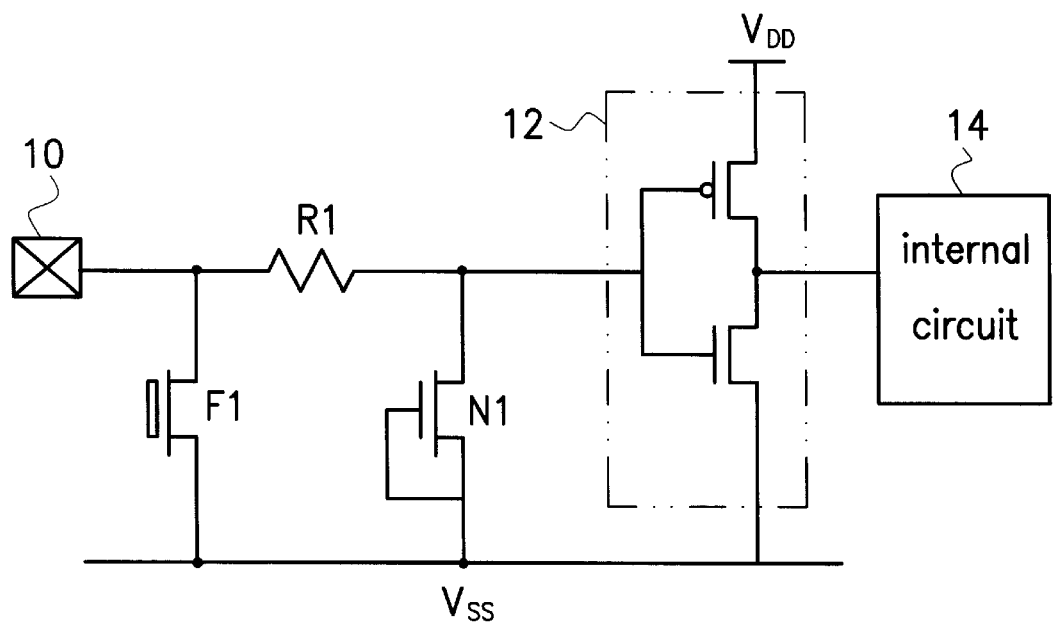
FIG. 1 is a circuit diagram of the conventional electrostatic discharge protection circuit.
Figure 2:
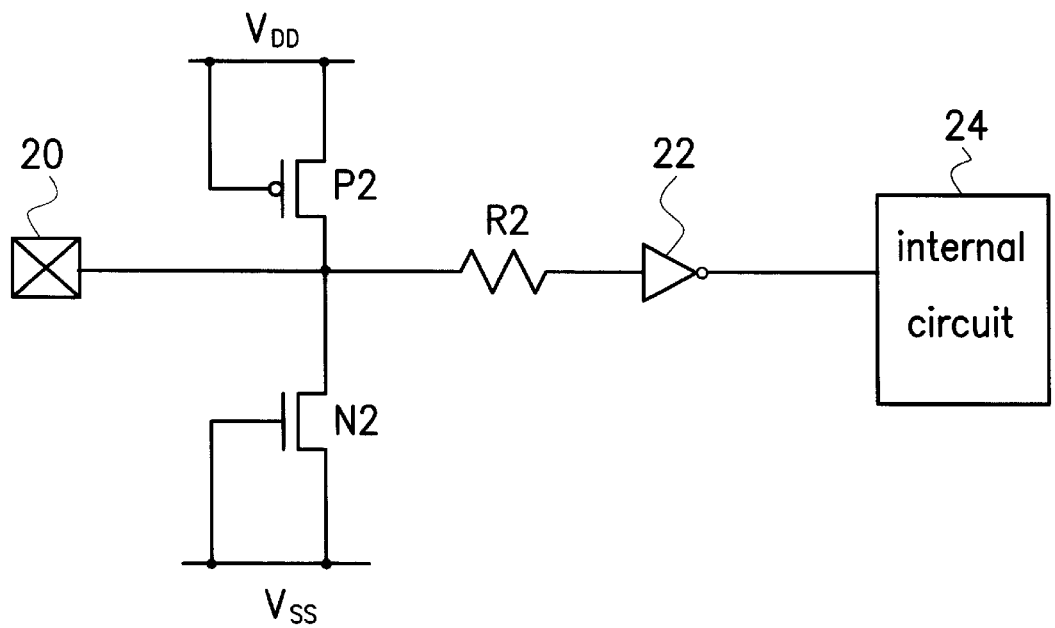
FIG. 2 is another circuit diagram of the conventional electrostatic discharge protection circuit.
Figure 3:
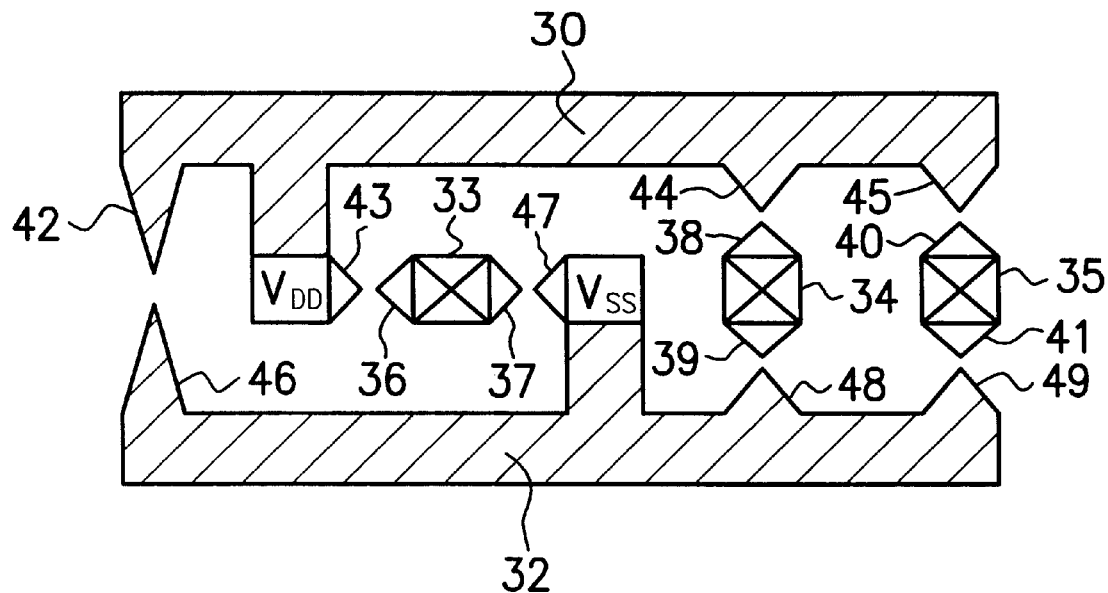
FIG. 3 is a circuit diagram according to a preferable embodiment of the invention.

FIG. 3 shows a circuit diagram in accordance with a preferred embodiment of the invention in which discharge of electrostatic energy by means of point discharge between bonding pads, between a bonding pad and a voltage line, and between voltage lines provides electrostatic discharge protection for the internal circuit.

The principle of point discharge is that the surface potential at any point of all connected conductors is the same, but the intensity of the electric field of each point is different due to their different curvature radii. For instance, the field intensity is much greater at a point with smaller curvature radius. According to that, induction of electrostatic energy between conductors produces point discharge.

Referring to FIG. 3, the voltage lines in the fabricating process of integrated circuits include, for example, a voltage line 30 for providing a high voltage (such as a direct bias $V_{DD}$), and a voltage line 32 for providing a low voltage $V_{SS}$ relative to $V_{DD}$. The embodiment, as shown in FIG. 3, provides point discharge structures 36, 37, 38, 39, 40, 41 for input bonding pads (also for output bonding pad or input/output ports) 33, 34, 35, point discharge structures 42, 43, 44, 45 for voltage line 30, and point discharge structures 46, 47, 48, 49 for voltage line 32. As an example of input bonding pad 33, the point discharge structures 36, 37 of input bonding pad 33 correspond respectively to point discharge structures 43, 47 of high level voltage line 30 and low level voltage line 32, which protects against electrostatic discharge without additional serial or parallel connecting components. For example, when the low voltage line $V_{SS}$ is grounded and the input bonding pad 33 is at high or low voltage level, it discharges to the point discharge structure 47 through the point discharge structure 37, and when the high voltage line $V_{DD}$ is grounded and the input bonding pad 33 is at high or low voltage level, it discharges to the point discharge structure 43 through the point discharge structure 36.

Figure 4:
FIG. 4 is another point discharge design structure of FIG. 3.

The point discharge structure in FIG. 3 is conical in shape. In addition, the point discharge structure can also be shaped as shown in FIG. 4 where at least one needle structures providing electrostatic discharge by point discharge are provided for input bonding pads and voltage lines.

Hence, one feature of this invention is that it avoids the conventional use of serial or parallel connecting components, by means of the principle of point discharge.

Another feature of this invention is that it can also protect the charged devices from damage by electrostatic discharge.

Another feature of this invention is that it is suitable for all semiconductor fabricating process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What claimed is:

1. An electrostatic discharge protection circuit using point discharge, for protecting an integrated circuit from electrostatic discharge, the integrated circuit at least including an input bonding pad, a high level voltage line, and a low level voltage line, wherein the electrostatic discharge protection circuit comprises:

a first point discharge structure and a second point discharge structure formed at the input bonding pad;

at least one third point discharge structure formed at the high level voltage line; and a least one fourth point discharge structure formed at said low level voltage line, wherein the first point discharge structure corresponds to one of the third point discharge structures, and the second point discharge structure corresponds to one of the fourth point discharge structures.

2. The electrostatic discharge protection circuit using point discharge of claim 1, wherein the first point discharge structure, the second point discharge structure, the third point discharge structure, and the fourth point discharge structure are conical.

3. The electrostatic discharge protection circuit using point discharge of claim 1, wherein the first point discharge structure, the second point discharge structure, the third point discharge structure, and the fourth point discharge structure have at least one needle structures.

4. The electrostatic discharge protection circuit using point discharge of claim 1, wherein the third point discharge structure further corresponds to the fourth point discharge structure.

5. The electrostatic discharge protection circuit using point discharge of claim 1, wherein the integrated circuit further comprises an output bonding pad, the electrostatic discharge protection circuit using point discharge further comprising:

a fifth point discharge structure and a sixth point discharge structure of the output bonding pad, wherein the fifth point discharge structure corresponds to the third point discharge structure, and the sixth point discharge structure corresponds to the fourth point discharge structure.

6. The electrostatic discharge protection circuit using point discharge of claim 5, wherein the fifth point discharge structure and the sixth point discharge structure are conical.

7. The electrostatic discharge protection circuit using point discharge of claim 5, wherein the fifth point discharge structure and the sixth point discharge structure have at least one needle structure.

8. The electrostatic discharge protection circuit using point discharge of claim 1, wherein the integrated circuit further comprises an input/output port, the electrostatic discharge protection circuit of point discharge further comprising:

a seventh point discharge structure and a eighth point discharge structure of the input/output port, wherein the seventh point discharge structure corresponds to the third point discharge structure, and the eighth point discharge structure corresponds to the fourth point discharge structure.

9. The electrostatic discharge protection circuit using point discharge of claim 8, wherein the seventh point discharge structure and the eighth point discharge structure are conical.

10. The electrostatic discharge protection circuit using point discharge of claim 8, wherein the seventh point discharge structure and the eight point discharge structure have at least one needle structure.

11. A electrostatic discharge protection circuit of point discharge, for protecting an integrated circuit from electrostatic discharge, the integrated circuit at least including a input bonding pad, a high level voltage line, and a low level voltage line, wherein the electrostatic discharge protection circuit comprises:

a plurality of first point discharge structures, located at a high level voltage line;

a plurality of second point discharge structures, located at a low level voltage line; and an input/output port, the input/output port having a third point discharge structure corresponding to one of the first point discharge structures, and a fourth discharge structure corresponding to one of the second point discharge structures.

12. The electrostatic discharge protection circuit using point discharge of claim 11, wherein the first point discharge structures, the second point discharge structures, the third point discharge structure, and the fourth point discharge structure are conical.

13. The electrostatic discharge protection circuit using point discharge of claim 11, wherein the first point discharge structures, the second point discharge structures, the third point discharge structure, and the fourth point discharge structure have a plurality of needle structures.

14. The electrostatic discharge protection circuit using point discharge of claim 11, wherein one of the first point discharge structures corresponds to one of the second point discharge structures.

* * * * *

UNITED STATES PATENT AND TRADEMARK OFFICE
CERTIFICATE OF CORRECTION

PATENT NO. : 6,052,269
DATED : April 18, 2000
INVENTOR(S) : Tien-Hao Tang et al

It is certified that error appears in the above-identified patent and that said Letters Patent is hereby corrected as shown below:

On the Title Page, Item 75, delete "Chungho" and insert -- Chungho City --.

Signed and Sealed this

Twenty-second Day of May, 2001

Attest:

NICHOLAS P. GODICI

*Attesting Officer*           *Acting Director of the United States Patent and Trademark Office*